(12) United States Patent
Watkins et al.

(10) Patent No.: US 11,967,798 B2
(45) Date of Patent: Apr. 23, 2024

(54) VERTICAL CAVITY SURFACE EMITTING LASER DEVICES

(71) Applicant: ams Sensors Asia Pte. Ltd., Singapore (SG)

(72) Inventors: Laurence Watkins, Eindhoven (NL); Jean-Francois Pierre Seurin, Eindhoven (NL); Chuni Ghosh, Eindhoven (NL)

(73) Assignee: ams Sensors Asia Pte. Ltd., Singapore (SG)

( * ) Notice: Subject to any disclaimer, the term of this patent is extended or adjusted under 35 U.S.C. 154(b) by 746 days.

(21) Appl. No.: 17/057,614

(22) PCT Filed: May 22, 2019

(86) PCT No.: PCT/SG2019/050270
§ 371 (c)(1),
(2) Date: Nov. 20, 2020

(87) PCT Pub. No.: WO2019/236005
PCT Pub. Date: Dec. 12, 2019

(65) Prior Publication Data
US 2021/0203131 A1    Jul. 1, 2021

Related U.S. Application Data

(60) Provisional application No. 62/680,126, filed on Jun. 4, 2018.

(51) Int. Cl.
*H01S 5/00* (2006.01)
*H01S 5/02* (2006.01)
(Continued)

(52) U.S. Cl.
CPC ........ *H01S 5/04257* (2019.08); *H01S 5/0208* (2013.01); *H01S 5/0261* (2013.01);
(Continued)

(58) Field of Classification Search
CPC .. H01S 5/04257; H01S 5/0208; H01S 5/0261; H01S 5/04256; H01S 5/0234; H01S 5/0237; H01S 5/183; H01S 5/18361
See application file for complete search history.

(56) References Cited

U.S. PATENT DOCUMENTS 7,289,547 B2    10/2007 Trezza et al.
9,705,284 B1 *  7/2017 Cheskis .............. H01S 5/32316
(Continued)

FOREIGN PATENT DOCUMENTS

| CN | 101061611 A | 10/2007 |
| CN | 101127433 A | 2/2008 |
| CN | 101964499 A | 2/2011 |

OTHER PUBLICATIONS

CN Appl. No. 201980052088.2, "Office Action", dated Jun. 30, 2023, 13 pages.
(Continued)

*Primary Examiner* — Kinam Park
(74) *Attorney, Agent, or Firm* — VIERING, JENTSCHURA & PARTNER mbB

(57) ABSTRACT

A VCSEL device includes a substrate and a laser cavity that includes a gain section disposed between first and second reflectors. The VCSEL device is operable to emit light through a first end of the VCSEL device. The VCSEL device includes an anode surface mount contact and a cathode surface mount contact, each which is disposed at a second end of the VCSEL device opposite the first end of the VCSEL device.

15 Claims, 3 Drawing Sheets

(51) Int. Cl.
*H01S 5/026* (2006.01)
*H01S 5/042* (2006.01)
*H01S 5/0234* (2021.01)
*H01S 5/0237* (2021.01)
*H01S 5/183* (2006.01)

(52) U.S. Cl.
CPC ........ *H01S 5/04256* (2019.08); *H01S 5/0234* (2021.01); *H01S 5/0237* (2021.01); *H01S 5/183* (2013.01); *H01S 5/18361* (2013.01)

(56) References Cited

U.S. PATENT DOCUMENTS

| | | | | |
|---|---|---|---|---|
| 2005/0224946 A1* | 10/2005 | Dutta | ................... | G02B 6/4257 |
| | | | | 257/686 |
| 2008/0043793 A1* | 2/2008 | Ueki | ................... | H01S 5/18311 |
| | | | | 372/38.05 |
| 2011/0019709 A1* | 1/2011 | Masui | ..................... | H01L 24/24 |
| | | | | 257/E31.113 |
| 2017/0063040 A1 | 3/2017 | Su et al. | | |

OTHER PUBLICATIONS

PCT/SG2019/050270 International Search Report and Written Opinion, dated Sep. 6, 2019; 10 pages.

\* cited by examiner

VERTICAL CAVITY SURFACE EMITTING LASER DEVICES

CROSS-REFERENCE TO RELATED APPLICATIONS

This application is a 371 U.S. National Phase of PCT International Patent Application No. PCT/SG2019/050270, filed on May 22, 2019, which claims benefit and priority to U.S. provisional patent application No. 62/680,126, filed on Jun. 4, 2018; the disclosures of which are each incorporated by reference herein in their entirety for all purposes.

FIELD OF THE DISCLOSURE

This disclosure relates to high-speed vertical cavity surface emitting laser (VCSEL) devices.

BACKGROUND

There is increasing demand for high-speed digital communications over fiber optic links. High-speed digital communications have been deployed in traditional long-haul communications systems. In recent years, high-speed digital communications are increasingly being used in short-haul links. These links include short-haul, high-speed data links for computers, high-speed Ethernet, and high-speed internet, including high-bandwidth local service to the home. There is also strong interest in these high-speed devices for short-link data transmission applications for cloud computing. Such applications include data links between computers and for large server installations. The development of higher-power, higher-speed VCSEL devices can facilitate and potentially broaden the application of high-speed data links.

Some applications for high-bandwidth optical communication and high-speed data communications utilizing VCSEL devices require that the VCSEL devices be optimized for operation at very high speed, including bandwidths up to 25 GHz, and in some cases, up to 40 GHz or higher.

Advances in VCSEL design have helped reduce the series resistance and device capacitance so as to enable higher-bandwidth modulation. Nevertheless, room for improvement remains. For example, one approach for the connection of high speed VCSEL devices to the driver electronics is to connect the two contact pads on the VCSEL directly to pads on the driver integrated circuit (IC) by wire bonds. In such implementations, the VCSEL and driver IC are placed adjacent one another on a substrate, such as a printed circuit board (PCB), and are connected electrically by wire bonds made between them. Another approach is to use a coplanar micro-strip or strip-line connection between the driver IC and the VCSEL. In either case, the connections introduce inductance or other loss, which can limit the bandwidth of the modulating signal and increase the pulse rise time.

SUMMARY

The present disclosure describes VCSEL devices in which both the anode and cathode surface mount contacts are located on the same side of the device, in particular, on the opposite side of the VCSEL from which the output beam is emitted.

For example, in one aspect, the present disclosure describes a VCSEL device that includes a substrate and a laser cavity over the substrate. The laser cavity includes a gain section disposed between first and second reflectors, wherein the VCSEL device is operable to emit light through a first end of the VCSEL device, and wherein the first end is closer to the first reflector than the second reflector. The VCSEL device further includes an anode surface mount contact and a cathode surface mount contact. Each of the anode and cathode surface mount contacts is disposed at a second end of the VCSEL device opposite the first end of the VCSEL device. The VCSEL device further includes a first electrical connection at the first end of the VCSEL device, and a second electrical connection at a surface of the second reflector. The first electrical connection is routed to the anode surface mount contact by way of an opening through the substrate, and the second electrical connection is routed to the cathode surface mount contact by way of an opening through the substrate.

Some implementations include one or more of the following features. For example, the first electrical connection can be routed to the anode surface mount contact by way of a first opening through the substrate, and the second electrical connection can be routed to the cathode surface mount contact by way of a different second opening through the substrate. In some instances, the first and second electrical connections are routed, respectively, through the same opening in the substrate. In some cases, the VCSEL device includes a dielectric layer that separates the first electrical connection from the gain region, the substrate and the second reflector. In some instances, the dielectric layer extends partially along a surface of the substrate near the second end to prevent electrical continuity between the anode surface mount contact and the substrate.

In some cases, each of the first and second reflectors is implemented as a respective distributed Bragg grating reflector. The first reflector can be, for example, a partial-reflectivity distributed Bragg grating reflector.

In some implementations, the substrate is a heavily doped semiconductor substrate. In other instances, the substrate is a semi-insulating semiconductor substrate.

A particular implementation described a top-emitting VCSEL device that includes a substrate, and epitaxial layers on the substrate, including a laser cavity having a gain section disposed between first and second distributed Bragg grating reflectors. The VCSEL device is operable to emit light through a top side of the VCSEL device. In this case, the top side of the VCSEL device is closer to the first distributed Bragg grating reflector than the second distributed Bragg grating reflector, and the first distributed Bragg grating reflector is partially-reflecting. The VCSEL device includes an anode contact pad and a cathode contact pad. Each of the anode and cathode contact pads is disposed at a bottom side of the VCSEL device opposite the top side of the VCSEL device.

The VCSEL devices can be incorporated into a high-speed communication system, wherein the VCSEL device is surface mount connected, for example, to output pads of a laser driver integrated circuit or to connection pads of a coplanar waveguide printed circuit.

Some implementations provide one or more of the following advantages. For example, the VCSEL designs described here can, in some cases, eliminate the need to wire bond the anode and cathode connections after bonding the VCSEL to a printed circuit board (PCB) or flex circuit. Overall manufacturing costs associated with mounting VCSELs to the PCB or other substrate can be lowered. Further, by eliminating inductance associated with wire bonds that are used in other techniques, the present designs can, in some cases, achieve higher speed VCSELs.

Other aspects, features and advantages will be apparent from the following detailed description, the accompanying drawings and the claims.

DETAILED DESCRIPTION

The present disclosure describes high-speed VCSEL devices in which both the anode and cathode surface mount contacts are located on the same side of the device, in particular, on the opposite side of the VCSEL from which the output beam is emitted. The VCSEL structures described here allow a surface-mountable VCSEL to be directly bonded (e.g., by flip-chip bonding), for example, to a driver IC. In this approach, inductance from wire bonds and loss incurred by using a micro-strip line connection can be eliminated. Further, in situations where a micro-strip or strip-line connection is used, the approaches described here still can eliminate the inductance from wire bonds by directly bonding the VCSEL to the micro-strip circuit.

Figure 1:
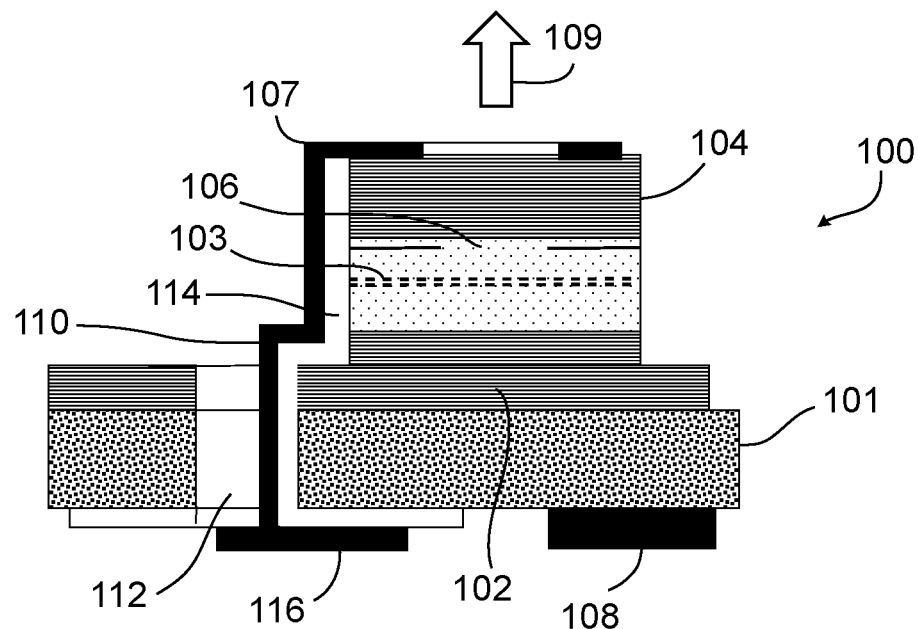
FIG. 1 illustrates the cross-section of a first VCSEL.

As shown in FIG. 1, a top-emitting VCSEL device 100 includes a substrate 101 on which epitaxial layers for the VCSEL structure are grown, for example, by a metal-organic chemical vapor deposition (MOCVD) or other deposition process. The VCSEL laser cavity is formed by a distributed Bragg grating (DBR) high-reflectivity (e.g., 100%) bottom reflector 102 and a DBR partial-reflectivity top reflector 104 to allow for emission of the VCSEL beam 109. A gain section 103 is disposed between the bottom reflector 102 and the top reflector 104. The gain section 103 can include quantum wells. A current aperture 106 confines the current in the center region of the VCSEL device 100 to activate the quantum wells to produce optical gain and to generate a laser cavity mode in the VCSEL laser cavity. In the top-emitting VCSEL device illustrated in FIG. 1, the output beam 109 is taken out of the partial-reflectivity top reflector 104.

The VCSEL device 100 is activated by applying current through an anode electrical connection 107 and cathode electrical connection 108. In general, the pulse bandwidth of a VCSEL device is controlled by the laser cavity photon lifetime, the electro-optical transitions in the quantum wells, and the electrical driving circuit, including the VCSEL electrical properties. The pulse bandwidth is sometimes referred to as the modulation bandwidth of the VCSEL device. The cavity lifetime and quantum-well transitions are very fast. Thus, the modulation bandwidth typically is limited by the electrical properties of the driver circuit, including connections to the VCSEL and the inductance, resistance and capacitance between the VCSEL electrical contacts, such as the anode and cathode connections 107, 108.

In the example of FIG. 1, the substrate 101 is a heavily doped n-doped semiconductor substrate. As the substrate 101 is heavily doped, the cathode contact 108 can be on the bottom side of the VCSEL (i.e., in direct contact with the substrate 101). In this case, the cathode connection 108 also serves as a surface mount pad. The anode connection 107 is made to the top of the VCSEL and then routed by metallization 110 to an anode pad (e.g., a surface mount pad) 116 at the bottom side of the VCSEL through an opening 112 (e.g., a via or trench) passing through the substrate 101. A dielectric layer 114 separates the anode connection 107 from the gain region 103, the substrate 101 and the bottom reflector 102 to prevent shorting out the device 100. The dielectric layer extends partially along the bottom surface of the substrate 101 to prevent electrical continuity between the anode surface mount contact 116 and the substrate 101.

As shown in FIG. 1, both the anode and cathode surface mount pads 116, 108 are located on the same side of the VCSEL 100, in particular, on the opposite side of the VCSEL from which the output beam 109 is emitted. Further, both contacts 107, 108 have very short connections to the VCSEL, resulting in relatively low inductance. Using the surface mount pads 116, 108, the VCSEL 100 can be bonded, using solder or other bonding material, directly to IC pads or a high-speed circuit component without the need for additional wire bond connections. The surface mount pads 116, 108 can be shaped to match the corresponding contact pads on the driver IC or the solder pads on the PCB or flex circuit.

Figure 2:
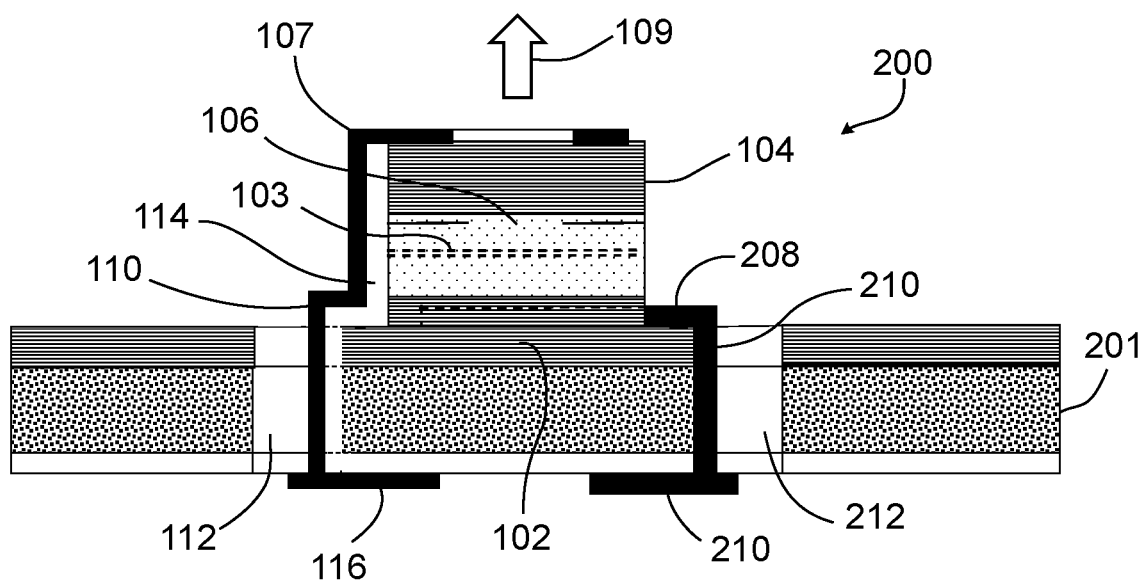
FIG. 2 illustrates the cross-section of a second VCSEL.
Figure 3A:
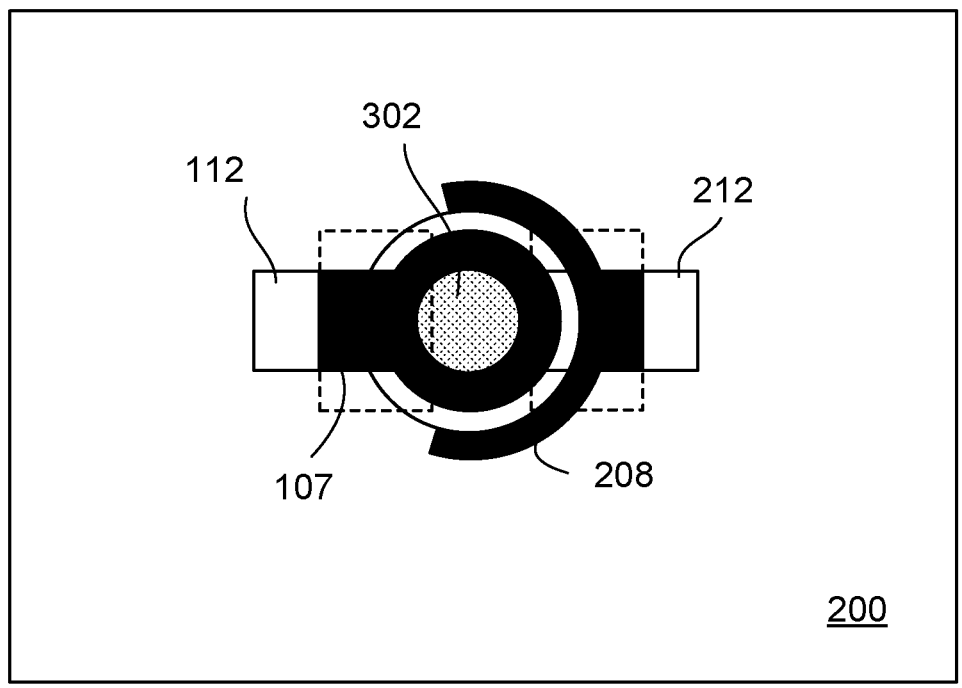
FIG. 3A is a top view of the VCSEL of FIG. 2.
Figure 3B:
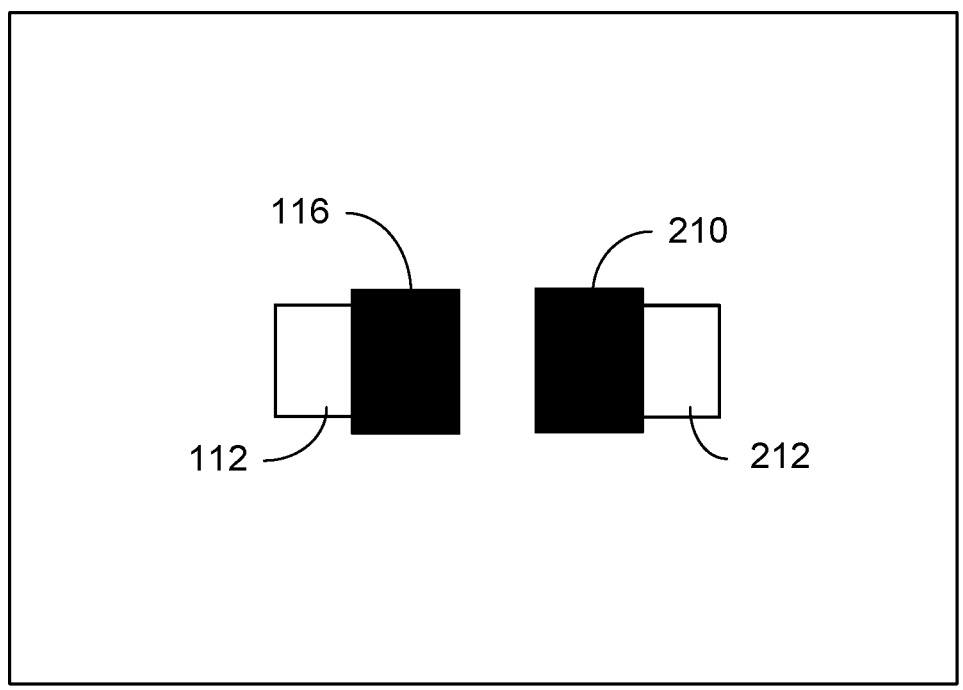
FIG. 3B is a bottom view of the VCSEL of FIG. 2.

Some high speed VCSEL designs use a semi-insulating semiconductor substrate, rather than heavily doped semiconductor substrate. In such situations, the substrate can no longer be used for connecting the bottom cathode pad to the VCSEL. FIGS. 2, 3A and 3B illustrate an example of a VCSEL device 200 to address this limitation. Features of the VCSEL 200 that are substantially the same as in the VCSEL 100 of FIG. 1 are identified using the same respective reference numerals. As shown in FIG. 2, the top-emitting VCSEL device 200 includes a semi-insulating semiconductor substrate 201 on which the VCSEL epitaxial structure is grown. The VCSEL laser cavity is formed by a DBR high-reflectivity (e.g., 100%) bottom reflector 102 and a DBR partial-reflectivity top reflector 104 to allow for emission of the VCSEL beam 109 through the VSCEL output area 302. The VCSEL 200 further includes a gain section 103 and a current aperture 106 as described in connection with the VCSEL 100 of FIG. 1.

As in the example of FIG. 1, the anode connection 107 in FIG. 2 is made to the top of the VCSEL and then routed by metallization 110 to an anode pad 116 at the bottom side of the VCSEL through an opening 112 (e.g., a via or trench). A dielectric layer 114 is disposed between the anode connection 107 and the gain region 103, substrate 101 and bottom reflector 102 to prevent shorting out the device 100. The dielectric layer 114 extends partially along the bottom surface of the substrate 101 to prevent electrical continuity between the anode surface mount contact 116 and the substrate 101.

As further shown in FIG. 2, the cathode connection 208 is made to the top of the bottom reflector 102 to route the current through the bottom reflector 102 and through the gain region 103 and aperture 106. In the illustrated example of FIG. 2, the cathode connection 208 routed by metallization 210 to a cathode pad (e.g., a surface mount pad) 210 at the bottom side of the VCSEL through a second opening 12 (e.g., a via or trench). Although separate opening 112, 212 are shown in the implementation of FIGS. 2, 3A and 3B, in some instances, a single larger opening can be used to route both the anode and cathode connections 107, 208 to the bottom side of the VCSEL chip.

In the example of FIG. 2, both the anode and cathode surface mount pads 116, 210 are located on the same side of the VCSEL 200, in particular, on the opposite side of the VCSEL from which the output beam 109 is emitted. Further, both surface mount pads 116, 210 have very short connections to the VCSEL, resulting in relatively low inductance. Using the surface mount pads 116, 210, the VCSEL 200 can be bonded, using solder or other bonding material, directly to IC pads or a high-speed circuit component without the need for additional wire bond connections. The surface mount pads 116, 210 can be shaped to match the corresponding contact pads on the driver IC or the solder pads on the PCB or flex circuit.

In general, any of the foregoing VCSEL devices can be incorporated into a high-speed communication system, wherein the VCSEL device is surface mount connected, for example, to output pads of a laser driver integrated circuit or to connection pads of a coplanar waveguide printed circuit.

Figure 4:
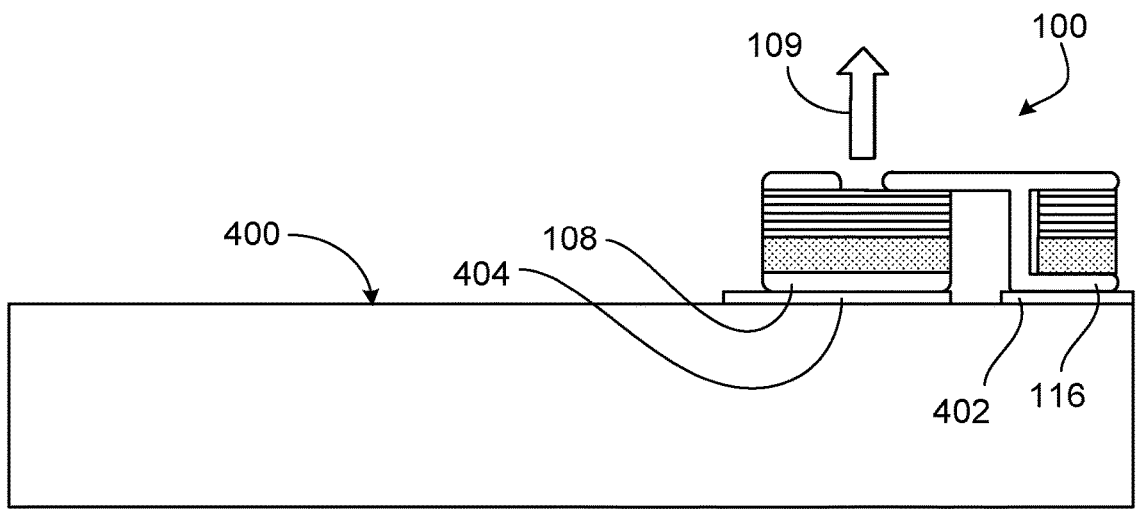
FIG. 4 illustrates an example of a VCSEL mounted on a driver IC.

FIG. 4 describes how a surface mount, high-speed VCSEL 100 (or 200) can be mounted directly on the output pads 402, 404 of a high-frequency VCSEL driver IC 400. The VCSEL output 109 is on the opposite side of the chip from the anode and cathode surface mount pads (e.g., 116 and 108 in FIGS. 1; 116 and 210 in FIG. 2) so that a direct connection can be made. In the illustrated example, intervening wire bonds or micro-strip PCB connections are not required.

Figure 5:
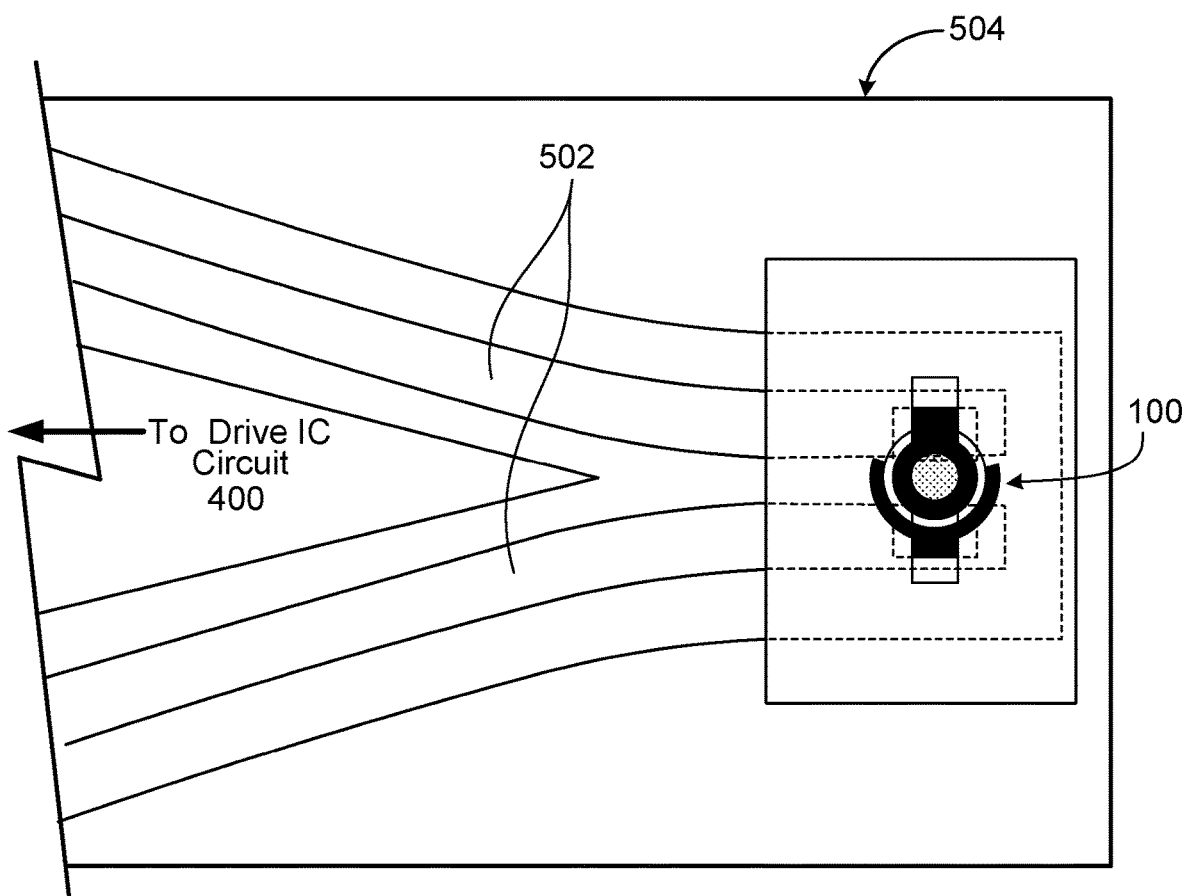
FIG. 5 illustrates an example of a VCSEL mounted on a coplanar waveguide printed circuit.

If the high-speed VCSEL module design incorporates a micro-strip, the VCSEL can be mounted in an efficient and low-cost manner using standard electronic surface mounting processes. As shown in FIG. 5, the surface mount pads of the high-speed VCSEL 100 (or 200) can be surface-mount soldered directly to a differential coplanar flex circuit waveguide 502, for example, on a PCB or other substrate 504. This process can eliminate the need to wire bond the anode and cathode connections after bonding the VCSEL to the flex circuit. The techniques described here can, in some instances, lower the overall manufacturing costs associated with mounting VCSELs to the PCB or other substrate and can eliminate inductance associated with the wire bonds that are used in other techniques.

Various modifications can be made to the VCSEL structures described above. For example, instead of a single gain region 103, the VCSEL can include a high-gain region that utilizes multiple stages of multiple quantum wells. For example, the gain region can include multiple gain sections in series, wherein each gain section includes quantum wells, and the gain sections are separated from one another by an electrical barrier. This approach can increase the gain and also reduce the effective junction capacitance. Such factors can contribute advantageously to a reduction in the pulse rise-time and to an increase in the modulation bandwidth of the VCSEL device.

The present disclosure thus describes VCSEL devices that, in some instances, can be used for operation at very fast (e.g., sub-nanosecond) rise-time pulsing and very high speed modulation rates (e.g., as much as 40 GHz or more). The VCSEL chip has both its anode and cathode high-speed electrical contacts on the bottom side for low inductance and low capacitance surface mounting to driver electronics. The VCSELs can be used for applications such as compact, high-sensitivity LIDAR time-of-flight (TOF) systems and optical, high-bandwidth communications for high-speed data links. Examples of such applications include measuring short distances in self-driving automobiles and other proximity sensing applications. The VCSELS devices also can be incorporated into three-dimensional sensing and gesture recognition, for example, in gaming and mobile devices. Further, in data-link applications, replacing low bandwidth data optoelectronics with higher bandwidth can enable existing fiber links to be upgraded at relatively low cost without the need to add fiber infrastructure.

Other implementations are within the scope of the claims.

What is claimed is:

1. A VCSEL device comprising:
a substrate;
a laser cavity over the substrate, the laser cavity including a gain section disposed between first and second reflectors, wherein the VCSEL device is operable to emit light through a first end of the VCSEL device, the first end being closer to the first reflector than the second reflector;
an anode surface mount contact; and
a cathode surface mount contact,
wherein each of the anode and cathode surface mount contacts is disposed at a second end of the VCSEL device opposite the first end of the VCSEL device, the VCSEL device further including:
a first electrical connection at the first end of the VCSEL device, wherein the first electrical connection is routed to the anode surface mount contact by way of an opening through the substrate; and
a second electrical connection at a surface of the second reflector, wherein the second electrical connection is either routed to the cathode surface mount contact by way of a same opening through the substrate as the first electrical connection is routed to the anode surface mount contact or by way of direct contact with the substrate.

2. The VCSEL device of claim 1 including a dielectric layer that separates the first electrical connection from the gain section, the substrate and the second reflector.

3. The VCSEL device of claim 2 wherein the dielectric layer extends partially along a surface of the substrate near the second end to prevent electrical continuity between the anode surface mount contact and the substrate.

4. The VCSEL device of claim 1 wherein the first reflector is a partial-reflectivity distributed Bragg grating reflector.

5. The VCSEL device of claim 1 wherein the substrate is a heavily doped semiconductor substrate.

6. The VCSEL device of claim 1 wherein the substrate is a semi-insulating semiconductor substrate.

7. The VCSEL device of claim 1 wherein the gain section includes multiple stages of multiple quantum wells.

8. A top-emitting VCSEL device comprising:
a substrate;
a plurality of epitaxial layers on the substrate, including a laser cavity having a gain section disposed between first and second distributed Bragg grating reflectors, wherein the VCSEL device is operable to emit light through a top side of the VCSEL device, the top side being closer to the first distributed Bragg grating reflector than the second distributed Bragg grating reflector, and wherein the first distributed Bragg grating reflector is partially-reflecting;
an anode contact pad; and
a cathode contact pad,
wherein each of the anode and cathode contact pads is disposed at a bottom side of the VCSEL device opposite the top side of the VCSEL device, the VCSEL device further including:
a first electrical connection at the top side of the VCSEL device, wherein the first electrical connection is routed to the anode contact pad by way of an opening through the substrate; and a second electrical connection at a surface of the second distributed Bragg grating reflector, wherein the second electrical connection is either routed to the cathode contact pad by way of a same opening through the substrate as the first electrical connection is routed to the anode contact pad or by way of direct contact with the substrate.

9. The VCSEL device of claim 8 including a dielectric layer that separates the first electrical connection from the gain section, the substrate and the second distributed Bragg grating reflector.

10. The VCSEL device of claim 9 wherein the dielectric layer extends partially along a surface of the substrate near the bottom side to prevent electrical continuity between the anode contact pad and the substrate.

11. The VCSEL device of claim 8 wherein the substrate is a heavily doped semiconductor substrate.

12. The VCSEL device of claim 8 wherein the substrate is a semi-insulating semiconductor substrate.

13. The VCSEL device of claim 8 wherein the gain section includes multiple stages of multiple quantum wells.

14. A high-speed communication system comprising:
a laser driver integrated circuit having output pads; and
a VCSEL device as in claim 1 or 8, wherein the VCSEL device is surface mount connected to the output pads of the laser driver integrated circuit.

15. A high-speed communication system comprising:
a coplanar waveguide printed circuit having connection pads; and
a VCSEL device as in claim 1 or 8, wherein the VCSEL device is surface mount connected to the connection pads of the coplanar waveguide printed circuit.

\* \* \* \* \*